United States Patent
Popplewell et al.

(10) Patent No.: US 6,608,871 B2
(45) Date of Patent: *Aug. 19, 2003

(54) DATA SLICERS

(75) Inventors: Andrew Popplewell, Manchester (GB); Stephen Williams, Manchester (GB)

(73) Assignee: LSI Logic Corporation, Milpitas, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/226,441

(22) Filed: Jan. 6, 1999

(65) Prior Publication Data

US 2002/0172301 A1 Nov. 21, 2002

(30) Foreign Application Priority Data

Jan. 9, 1998 (GB) .............................................. 9800353
May 20, 1998 (GB) .............................................. 9810787

(51) Int. Cl.$^7$ ........................... H04L 27/06; H03D 1/00; H03D 3/24
(52) U.S. Cl. ....................... 375/316; 375/340; 375/376; 375/377
(58) Field of Search ................................. 375/286, 287, 375/316, 317, 340, 342, 377, 354, 355, 371, 373, 376; 327/50, 74, 75, 77, 141, 155; 348/465, 468; 331/1 A, 1 R, 17, 25

(56) References Cited

U.S. PATENT DOCUMENTS

| 5,412,692 A | * | 5/1995 | Uchida ........................ 375/317 |
| 5,469,091 A | | 11/1995 | Takahashi et al. ............ 327/73 |
| 5,572,558 A | * | 11/1996 | Beherns ........................ 375/376 |
| 6,246,723 B1 | * | 6/2001 | Bliss et al. .................. 375/265 |

FOREIGN PATENT DOCUMENTS

| WO | WO 93/19547 | 9/1993 | ............. H04L/7/00 |
| WO | WO 93/26110 | 12/1993 | ........... H04L/25/06 |

* cited by examiner

Primary Examiner—Betsy L. Deppe
(74) Attorney, Agent, or Firm—Christopher P. Maiorana, P.C.

(57) ABSTRACT

An apparatus generally having a threshold slicer, a state logic device and a converter. The threshold slicer may be configured to generate a (i) first signal having an initial state of a plurality of states in response to a preceding value and a present value from an input signal and (ii) a second signal having a plurality of levels in response to the preceding value and the present value. The state logic device may be configured to generate a third signal having a sequence of the plurality of states starting with the initial state in response to the first signal. The converter may be configured to generate an output signal having the plurality of levels in response to the plurality of states in the third signal.

20 Claims, 3 Drawing Sheets

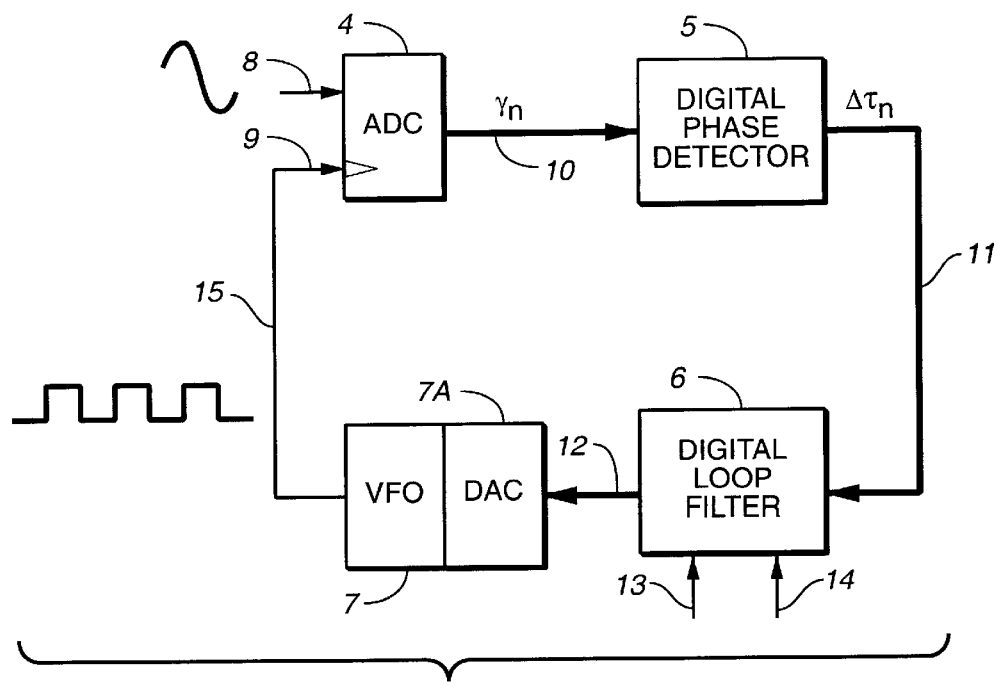
FIG._1
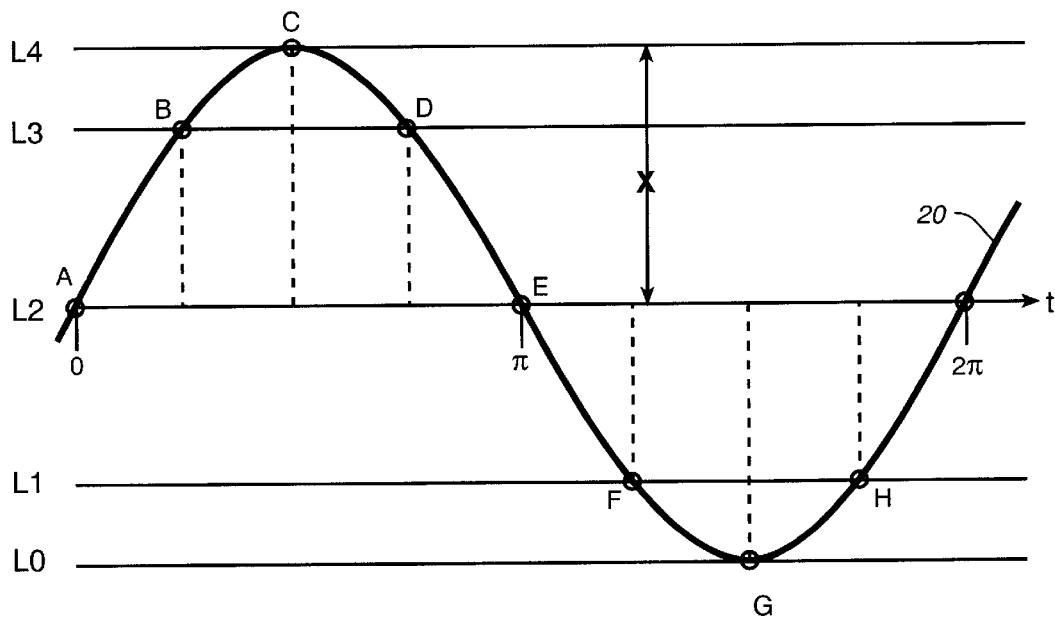
FIG._2

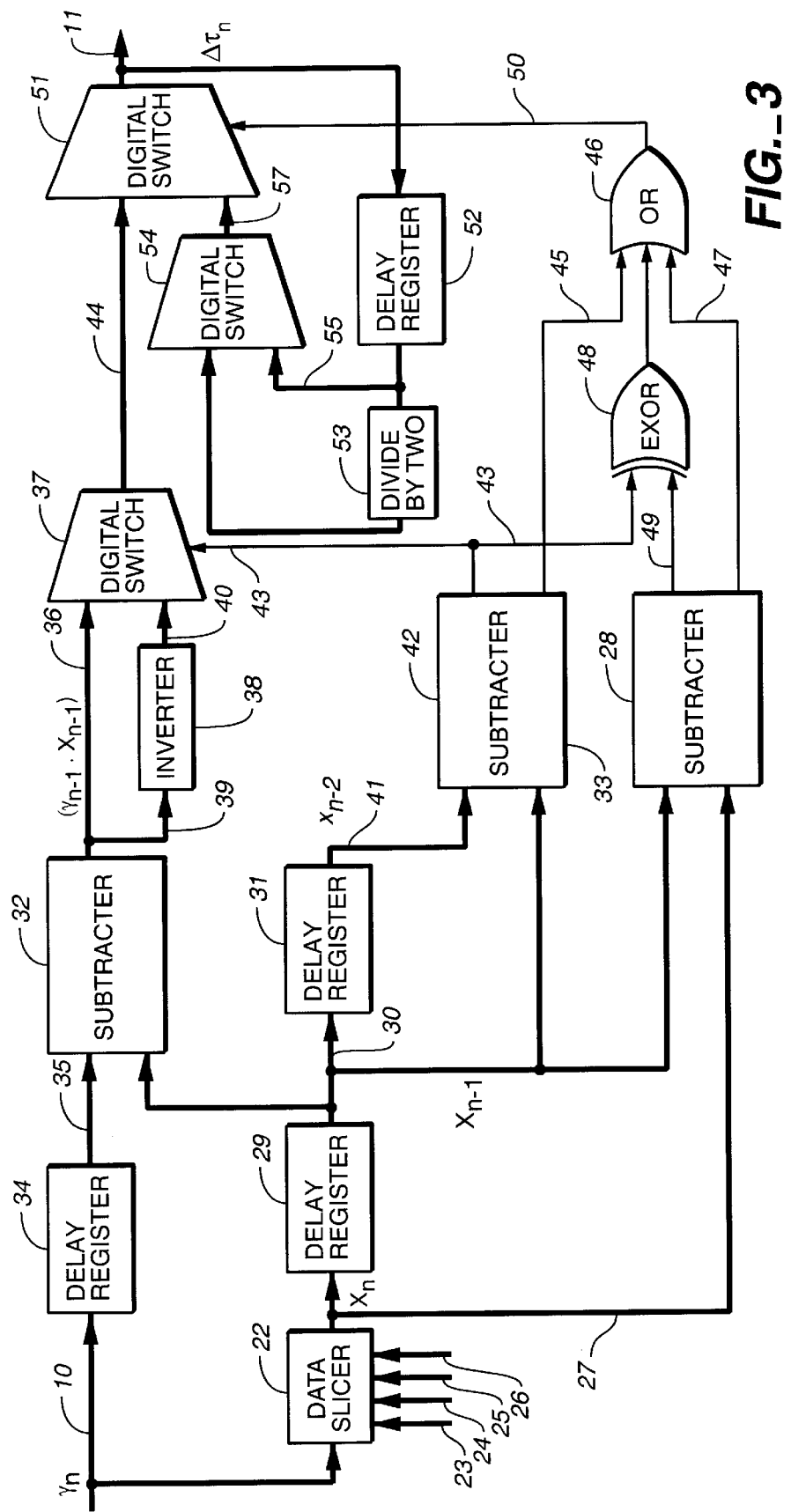
FIG._3

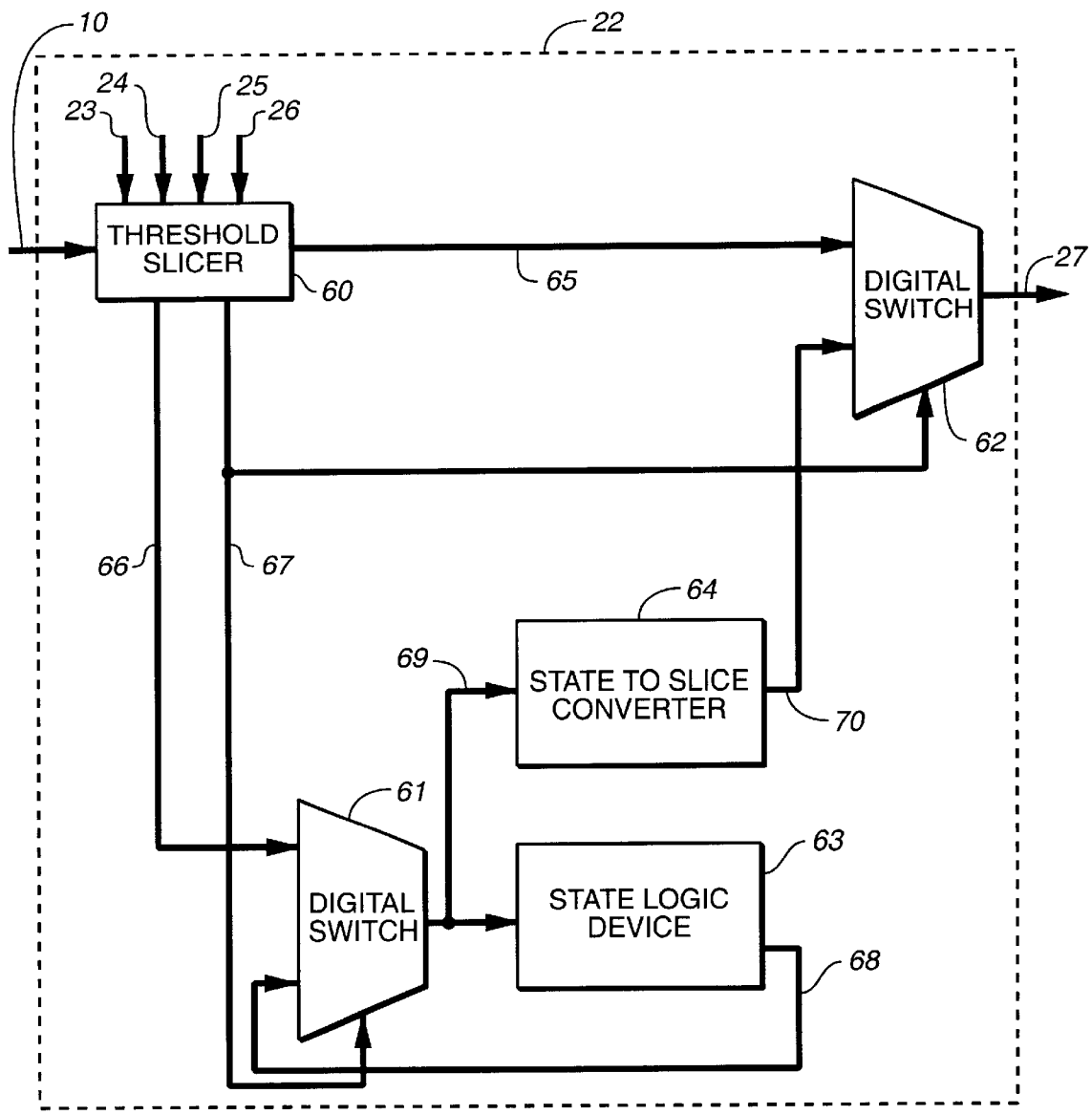
FIG._4

DATA SLICERS

CROSS REFERENCE TO RELATED APPLICATIONS

The present application is related to co-pending application Ser. No. 09/266,440 filed concurrently, now U.S. Pat. No. 6,304,071.

FIELD OF THE INVENTION

The present invention relates to data slicers.

A phase detector described in this application is the subject of UK Patent Application No. 9800353.6.

BACKGROUND OF THE INVENTION

To recover data from noisy channels, such as for example magnetic data carriers having high data densities, it is known to class the write/read channel of the data carrier in accordance with a partial response characteristic which approximates to the frequency response characteristics of the channel, and select the arrangement or design of a digital data recovery circuit to optimize data recovery from a channel with that partial response characteristic. As the correct recovery of data is so dependent on how well the channel characteristics are matched by the form of data recovery circuit selected, it is common to provide an equalizer circuit on the input of the data recovery circuit to compensate for any difference between the actual and the approximated channel characteristics.

The data recovery circuit contains a phase-lock loop circuit arrangement which receives an analog read signal, from the equalizer circuit if there is one, and operates to control an oscillator at the phase and an integer multiple frequency of components of interest of the incoming data stream. Signals generated by this oscillator are used to sample the incoming analog signal at appropriate sampling points, from which samples data recovery is performed. Correct phase alignment of the oscillator signals and the components of interest of the analog read signal are critical in performing correct data recovery.

To assist the phase lock loop circuit arrangement in achieving fast initial frequency and phase alignment, the data carrier will usually have one or more regions in which VFO field data has been intentionally written. The VFO field data is a regular data pattern which, when being read, provides an analog signal which in approximately sinusoidal and periodic in nature. In using these data channels, it is known for the data to be encoded to contain a minimum of two consecutive like bits in the data stream, and the VFO field data may for example comprise a succession of pairs of like data bits.

It is widely appreciated that certain types of optical data carrier channels currently being investigated for development will have a response characteristic approximating that of equation (1).

$$F(D)=a+bD+bD^2+aD^3 \qquad \text{Eqn. (1)}$$

Here, a and b are constant coefficients and D is a unit delay operator. This type of channel can be referred to as a class of partial response PR(a, b, b, a) channel.

SUMMARY OF THE INVENTION

In accordance with the present invention, a data slicer comprises means to use knowledge of the value of an input signal received on at least one clock cycle preceding a current clock cycle to estimate where in the period of a read signal a present sample value relates to, and means to provide an output signal using extrapolation of the preceding values.

In accordance with a second aspect of the present invention, a data slicer comprises:

ideal signal level determining means for determining an ideal signal level which most closely corresponds to the signal level of an input signal at a sampling point;

state means for providing a plurality of states each state corresponding to a sampling point in the period of the input signal and each state having associated therewith an ideal signal level;

state determining means for determining the initial state of the state means in response to the determined ideal signal level, and means thereafter to step the state means sequentially through the plurality of states at the sampling rate, the ideal signal level corresponding to the current state being provided as an output signal.

Preferably the state determining means determines the initial state in response also to an ideal signal level determined for a preceding sampling point.

BRIEF DESCRIPTION OF THE DRAWINGS

An embodiment of the present invention will now be described with reference to the accompanying drawings of which;

FIG. 1 shows a digital phase-lock loop in which a data slicer in accordance with the present invention can be incorporated;

FIG. 2 shows an analog VFO field data read signal and ideal sampling points thereof;

FIG. 3 shows the phase detector of the FIG. 1 phase-lock loop; and

FIG. 4 shows a data slicer in accordance with the present invention, forming part of the phase detector of FIG. 3.

DETAILED DESCRIPTION OF THE PRESENT INVENTION

Referring to FIG. 1, the digital phase lock loop comprises a flash analog to digital convertor (ADC) 4, a digital phase detector 5, a digital loop filter 6 and a variable frequency oscillator (VEC) 7.

The ADC 4 receives an analog read signal on an input terminal 8 and provides a digital value $Y_n$, representative of the amplitude of the read signal at the rising edge of a clock signal received on a clock input terminal 9, to the phase detector 5 on a first digital line 10. The phase detector provides a phase error value $\Delta\tau_n$, representative of a calculated difference between the actual phase of the clock signal and a desired phase, to the digital loop filter 6 on a second digital line 11. The digital filter 6 operates on the phase error value $\Delta\tau_n$, to provide a filtered phase error value to a digital to analog converter 7A on the input of the VFO 7 on a third digital line 12. The frequency response of the filter 6 may be varied by application of different filter coefficients to coefficient input terminals 13 and 14. The VFO 7 provides a limited signal, having a phase and a frequency dependent on the signal received on the third digital line 12, on a clock line 15 to the clock input terminal 9 of the ADC 4.

Referring now to FIG. 2, the VFO field data read signal 20 is shown having an approximately sinusoidal shape of amplitude X Volts and period $2\pi t$ seconds. First to eighth ideal sampling points A to H correspond to quarters of $\pi t$ from 0 to 7 π/4 as shown, thus forming eight sampling points at regular intervals in the period of the signal 20.

When phase-locking and frequency-locking to the VFO field data read signal, the phase detector 5 of the present invention is set into an "acquisition" mode, in which the phase detector 5 performs the computations of Equations (2) and (3) to determine the sense of change of the amplitude of the input signal to the amplitude of the input signal at the sampling times t=n and t=n−1 respectively.

$$\text{grad1}=\text{sign}(X_n-X_{n-1}) \qquad \text{Eqn (2)}$$

$$\text{grad2}=\text{sign}(X_{n-1}-X_{n-2}) \qquad \text{Eqn (3)}$$

where: $X_n$ is an ideal sample value at a time t=n;

$X_{n-1}$ is an ideal sample value at the preceding sample time, t=n−1; and $X_{n-2}$ is the ideal sample value at the twice preceding sample time, t=n−2.

Following this computation, grad1 is +1 if $X_n > X_{n-1}$; −1 if $X_n < X_{n-1}$ and 0 if $X_n = X_{n-1}$. Grad2 is similarly derived.

From the results of the computations of equations (2) and (3), a value for grad is derived from the calculation shown in equation (4).

$$grad = \begin{matrix} grad1 & \text{if } grad1 = grad2 \\ 0 & \text{otherwise} \end{matrix} \qquad \text{Eqn. (4)}$$

When grad is not equal to zero, the computation of equation (5) is performed.

$$\Delta\tau_n = \text{grad}(Y_{n-1}-X_{n-1}) \qquad \text{Eqn (5)}$$

where:

$\Delta\tau_n$ is a phase error value at time t=n, $Y_{n-1}$ is a sample value at time t=n−1, and $X_{n-1}$ is the ideal sample value at time t=n−1.

When grad is equal to zero, the phase detector 5 determines the phase error value as in Equation (6).

$$\Delta\tau_n = \Delta\tau_{n-1} \qquad \text{Eqn. (6)}$$

The result of these calculations is that for all sample points where the gradient of the read signal 20 is the same for two successive sample intervals, i.e. sample points A, B, C, E, F and G, the phase error value is proportional to the difference between the actual sample value and the ideal sample value at time t=n−1. It will be noted that a new phase error value $\Delta\tau_n$ is thus calculated six times in the period of the VFO field data read signal 20.

The phase detector 5 is shown in detail in FIG. 3, in which the first digital line 10 and the second digital line 11 are six bit digital lines, thus allowing each of $Y_n$ and $\Delta\tau_n$ to assume a decimal value in the range of −32 to +31.

The value of $Y_n$ on the digital line 10 is examined by a data slicer 22, which then determines the ideal sample value. In a conventional data slicer, this determination is made by digitally comparing $Y_n$ to four thresholds provided on respective ones of slicer threshold inputs 23, 24, 25 and 26. The threshold provided on the input 23 corresponds to the mean value of L0 and L1, the threshold on the input 24 corresponds to the mean value of L1 and L2, the threshold provided on the input 25 corresponds to the mean value of L2 and L3, and the threshold provided on the input 26 corresponds to the mean value of L3 and L4. By examining which of the thresholds are exceeded by $Y_n$, the conventional data slicer 22 determines which of the levels L0, L1, L2, L3 and L4 $Y_n$ is most similar to in value, and provides the value so determined on a further digital line 27 as $X_n$.

In accordance with the present invention, the data slicer 22 uses knowledge of the value of $Y_n$ received on preceding clock cycles to estimate where in the period of the read signal 20 the present sample value relates to, and determine $X_n$ using extrapolation of preceding values of $Y_n$ and examination of the current value of $Y_n$. This alternative provides a phase detector 5 which is less likely to determine an incorrect value of $X_n$ in the face of a noisy read signal 20 than the conventional data slicer arrangement described above.

In FIG. 4, the data slicer 22 is shown, comprising a threshold slicer 60, first and second digital switches 61, 62, a state logic device 63 and a state to slice converter device 64.

The digital line 10 is connected to the input of the threshold slicer 60 which provides, on an output line 65, a sliced value (a digital portion of the digital value $Y_n$ on the line 10), which is thereby provided to a first input of the switch 62. The threshold slicer 60, in providing the sliced value on the digital line 65, thus operates in the same way as the conventional data slicer described above by determining the signal level L0 to L4 (corresponding to predetermined portions of the value $Y_n$ on the line 10), which most closely corresponds to the level of the input signal. The threshold slicer 60 further includes logic arranged to provide a digital signal on a digital line 66 which identifies the starting state of a state machine. The starting state is determined by observing the sliced values for two successive signal levels which correspond to a valid succession of signal levels. Whereas the sliced value provided on the line 65 may be any one of the levels L0 to L4, the value provided on the line 66 falls within the range of 1 to 8, that is it identifies the starting state of the state machine based on the first two initial valid threshold states.

To implement the data slicer components 61, 63 and 64, the threshold slicer provides a logic 1 signal on a further line 67. The line 67 is connected to the switching inputs of each of the digital switches 61 and 62. In this way, each of the switches 61, 62 is controlled to pass through to its output the signal which is present on its opposite input, i.e. the input shown lowermost in FIG. 4. However, before signals provided by the data slicer components 61, 63 and 64 can be provided on the line 27, the line 67 must be provided with a logical 0 signal for a minimum of two samples before it is switched to allow the threshold slicer 60 to determine the (approximate) phase of the signal received on the line 10.

The state logic device 63 contains logic which is able to cycle through states 1 to 8, corresponding to levels L2-L3-L4-L3-L2-L1-L0-L1 respectively, with the sampling clock at the sampling frequency. The state logic device 63 receives the starting state, determined by logic in the threshold slicer 60, from the digital line 66. The state logic device 63 initiates itself using the starting state so received and thereafter cycles sequentially through the states with the frequency of the sampling clock. The state logic device provides on its output line 68 a digital value in the range 1 to 8 corresponding to the current state present in the device 63.

The signal provided on an output line 69 of the switch 61 is, when the line 67 is at a logical 1, that provided on the output line 68 of the state logic device 63. In this way, the state to slice converter 64 is provided, after the initial state determination, with a value corresponding to the current state of the state logic device 63. The state to slice converter 64 provides on its output line 70 a slice value corresponding to the level L0 to L4 which corresponds to the current state provided by the state logic device 63. As the switch 62, after the initial state determination, provides on the output line 27 the signal received on the line 70, the output of the data slicer 22 is determined by the state logic device 63 and the sampling clock and is thus not susceptible to slicing errors occurring in the threshold slicer 60. The present data slicer is thus less susceptible to cycle stealing or slipping than the conventional data slicer described above.

In FIG. 3, the digital line 27 carries the value of $X_n$ provided by the data slicer 22 to a subtracter device 28 and to a delay register 29. The delay register 29 provides the value provided by the data slicer 22 on the preceding clock cycle, i.e. $X_{n-1}$, on a further digital line 30 to a further delay register 31, to a second subtracter 32 and to a third subtracter 33.

The subtracter device 32 digitally subtracts $X_{n-1}$, received on the line 30, from derived from $X_n$ on the line 10 by a further delay register 34 and provided thereby on a further digital line 35, and provides a difference value $Y_{n-1}-X_{n-1}$ corresponding to the difference between these values on a further digital line 36. A digital switch 37 receives both the difference value from the subtracter device 32 and the inverse of the difference value from an inverter device 38. The inverter device 38, in effect, inverts the sign of the value of $Y_{n-1}-X_{n-1}$ on a branch 39 of the line 36 and provides the result to the digital switch 37 on a line 40.

The delay register 31 provides on a further digital line 41 the value of $X_n$ on the twice preceding clock cycle, i.e. $X_{n-2}$, which is then subtracted from the value of $X_{n-1}$ by a further subtracter 42. The sign of the result of this subtraction, which is the calculation of Equation (3), is thus representative of the sense of change to the preceding ideal sample value from the twice preceding sample value. This sign, when positive, is provided as a logical 1 signal on an output line 43 to a switch control input of the digital switch 37 and to an input of an EXOR gate 48. Thus, a positive result from the Equation (3) calculation causes the $Y_{n-1}-X_{n-1}$ value from the line 36 to be provided on a further digital line 44, and a negative result from the Equation (3) calculation causes the inverse value from the line 40 to be provided on the line 44. The switch 37 thus performs the calculation of Equation (5), operating on the difference value in dependence on the sense of change to the preceding ideal sample value from the twice preceding sample value. Where the subtraction of $X_{n-2}$ from $X_{n-1}$ results in zero, i.e. there is no sign, a logical 1 signal is provided on an output line 45 to an input of an OR gate 46.

The subtracter 28, functionally similar to the subtracter 42, provides a logical 1 signal on an output line 47 to an input of the OR gate 46 if the subtraction of $X_{n-1}$ from $X_n$ results in zero. The sign of the result of this subtraction, which is the result of the calculation of equation (2), is thus representative of the sense of change to the ideal sample value from the preceding ideal sample value. This sign, when positive, is provided as a logical 1 signal to an input of the EXOP. gate 48 on a line 49, and is provided as a logical 0 signal on the line 49 otherwise.

The effect of the OR gate 46 and the EXOR gate 48, which has its output connected to a further input of the OR gate 46, is to provide a logical 1 signal on an output line 50 of the OR gate 46 when any of the following conditions are satisfied: the result of equation (2) is zero; the result of equation (3) is zero; or one but not the other of equations (2) and (3) has a positive result. The arrangement 46, 48 thus determines when both of the senses of change are the same and are non-zero.

The output line 50 of the OR gate 46 is connected to the switch control input of a further digital switch 51. The value on the digital line 44, which is the result of the Equation (5) calculation, is passed as $\Delta\tau_n$ onto the output digital line 11 of the switch 51 when a logical 0 signal is present on the line 50. When the signal provided by the OR gate 46 on the line 50 a logical 1, the switch 51 is caused to pass as $\Delta\tau_n$ onto the line 11 a value provided by a feedback circuit comprising a further delay register 52, a divide by two device 53 and a further digital switch 54. The delay register 52 receives the value of $\Delta\tau_n$ from the digital line 11 and provides the value of $\Delta\tau_n$ on the preceding clock cycle; i.e. $\Delta\tau_{n-1}$, on a further digital line 55 to both of an input of the switch 54 and an input of the divide by two device 53. The divide by two device 53 provides one half of the $\Delta\tau_n$ value to a second input of the switch 54 on a further digital line 56.

Whether the switch 54 passes the value from the divide by two device 53 or the value from the delay register 52 to the second input of the switch 51 on a further digital line 57 depends on the logic signal applied to the control switch input of the switch 54. Preferably a mode device (not shown) provides a logical 1 signal to the switch control input of the switch 54, thereby providing the output value of the delay register 52 to the switch 51, when the phase-lock loop of FIG. 1 is in acquisition mode, and provides a logical 0 signal to the switch control input of the switch 54 when in a track mode.

In this way, because the value of $\Delta\tau_n$ is held from the preceding clock cycle when either of equations (2) and (3) result in zero or one but not the other has a positive result, rapid lock can be achieved when reading VFO field data. When in a track mode, the holding of the value of $\Delta\tau_n$ from the preceding clock cycle could cause the phase-lock loop to become unlocked when the read signal contains a significant number of consecutive like bits. To avoid this situation, the mode device (not shown) switches the digital switch 51 to receive values from the divide by two device 53. In this way, the "valid" value of $\Delta\tau_n$, i.e. the previous term calculated from a sample value where the OR gate 46 provided a logical 0 output signal, is successively divided by two for every sample time instance, until the value of $\Delta\tau_n$ eventually dwindles to zero, or a "valid" value of $\Delta\tau_n$ occurs.

What is claimed is:

1. An apparatus comprising:
   a threshold slicer configured to generate a (i) first signal having an initial state of a plurality of states in response to a preceding value and a present value from an input signal and (ii) a second signal having a plurality of levels in response to said preceding value and said present value;
   a state logic device configured to generate a third signal having a sequence of said plurality of states starting with said initial state in response to said first signal; and
   a converter configured to generate an output signal having said plurality of levels in response to said plurality of states in said third signal.

2. The apparatus in accordance with claim 1, wherein said threshold slicer is further configured to determine said initial state in response to a plurality of thresholds generated externally to said threshold slicer.

3. The apparatus in accordance with claim 1, further comprising:
   a switch configured to generate a first digital signal by switching between said second signal and said output signal.

4. The apparatus in accordance with claim 3, wherein said threshold slicer is further configured to control said switch.

5. The apparatus in accordance with claim 4, wherein said threshold slicer is further configured to control switching of said first digital signal from said second signal to said output signal.

6. The apparatus in accordance with claim 3, further comprising:
- a phase detector (i) comprising said threshold slicer and (ii) configured to generate a second digital signal in response to said first digital signal and said input signal;
- a filter configured to filter said second digital signal to generate a filtered second digital signal; and
- an oscillator configured to generate a clock signal in response to said filtered second digital signal.

7. The apparatus in accordance with claim 6, in which said first digital signal comprises an amplitude of the input signal on a rising edge of the clock signal.

8. The apparatus in accordance with claim 6, in which said second digital signal comprises a calculated difference between an actual phase of said clock signal and a desired phase.

9. The apparatus in accordance with claim 6, in which said second digital signal comprises a phase error value.

10. The apparatus in accordance with claim 6, in which said filter is further configured to provide a variable frequency response in response to one or more filter coefficients.

11. The apparatus in accordance with claim 6, in which said phase detector is further configured to perform one or more computations to determine a phase of said input signal over one or more sampling times.

12. An apparatus comprising:
- means for generating a first signal having an initial state of a plurality of states in response to a preceding value and a current value from an input signal;
- means for generating a second signal having a plurality of levels in response to said preceding value and said current value;
- means for generating a third signal having a sequence of said plurality of states starting with said initial state in response to said first signal; and
- means for generating an output signal having said plurality of levels in response to said plurality of states in said third signal.

13. The apparatus in accordance with claim 12, in which said means for generating said first signal is further configured to determine the initial state in response to an observation that at least two successive values from said input signal correspond to a valid succession.

14. A method of processing an input signal, comprising:
- (A) generating a first signal having an initial state of a plurality of states in response to a preceding value and a current value from said input signal;
- (B) generating a second signal having a plurality of levels in response to said preceding value and said current value;
- (C) generating a third signal having a sequence of said states starting with said initial state in response to said first signal; and
- (D) generating an output signal having said plurality of levels in response to said plurality of states in said third signal.

15. A method in accordance with claim 14, in which the initial state is determined by observing that at least two successive values from said input signal correspond to a valid succession.

16. The method in accordance with claim 14, in which each of said plurality of states corresponds to an amplitude of the input signal on an edge of a clock signal.

17. The method in accordance with claim 16, in which a phase error value comprises a calculated difference between an actual phase of said clock signal and a desired phase.

18. The method in accordance with claim 17, in which said initial state determines said phase error value.

19. The method in accordance with claim 14, further comprising:
- generating a first digital signal by switching between said second signal and said output signal.

20. The method in accordance with claim 19, wherein said first digital signal is switched from said second signal to said output signal.

* * * * *